United States Patent [19]
Parkhe

[11] Patent Number: 5,909,355
[45] Date of Patent: Jun. 1, 1999

[54] CERAMIC ELECTROSTATIC CHUCK AND METHOD OF FABRICATING SAME

[75] Inventor: Vijay Parkhe, Sunnyvale, Calif.

[73] Assignee: Applied Materials, Inc., Santa Clara, Calif.

[21] Appl. No.: 08/982,679

[22] Filed: Dec. 2, 1997

[51] Int. Cl.[6] .................................................. H02N 13/00
[52] U.S. Cl. ........................................ 361/234; 279/128
[58] Field of Search ............................. 361/234; 279/128

[56]  References Cited

U.S. PATENT DOCUMENTS

| | | | |
|---|---|---|---|
| 4,661,315 | 4/1987 | Wiech, Jr. | 419/10 |
| 4,717,340 | 1/1988 | Wiech, Jr. | 432/199 |
| 4,722,824 | 2/1988 | Wiech, Jr. | 419/6 |
| 5,117,121 | 5/1992 | Watanabe et al. | 307/130 |
| 5,151,845 | 9/1992 | Watanabe et al. | 361/234 |
| 5,463,526 | 10/1995 | Mundt | 361/234 |
| 5,701,228 | 12/1997 | Ishii | 361/234 |

*Primary Examiner*—Fritz Fleming
*Attorney, Agent, or Firm*—Thomason & Moser

[57]  ABSTRACT

Multi-layered, ceramic electrostatic chuck for retaining a substrate in a process chamber is provided. The chuck comprises a first layer having a top surface, a second layer disposed on the top surface of the first layer, and a third layer disposed on top of the second layer. The second layer alters the resistivity of the third layer during the fabrication process of the chuck. As such, the resistivity of the chuck is reduced to a value that facilitates establishment of the Johnsen-Rahbek effect and promotes wafer processing at room temperature.

19 Claims, 2 Drawing Sheets

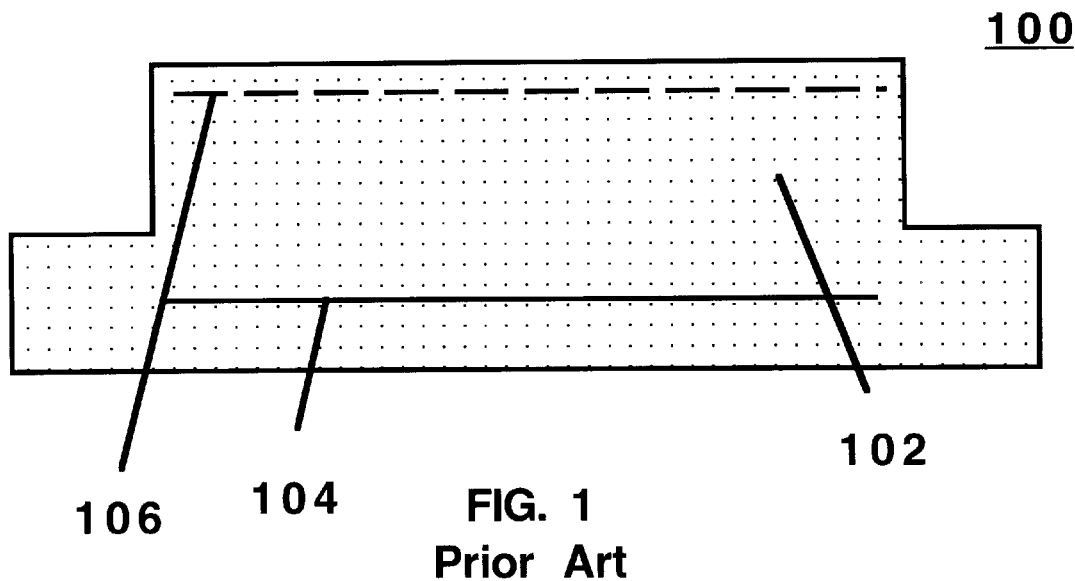
100
**106  104  FIG. 1
Prior Art  102**
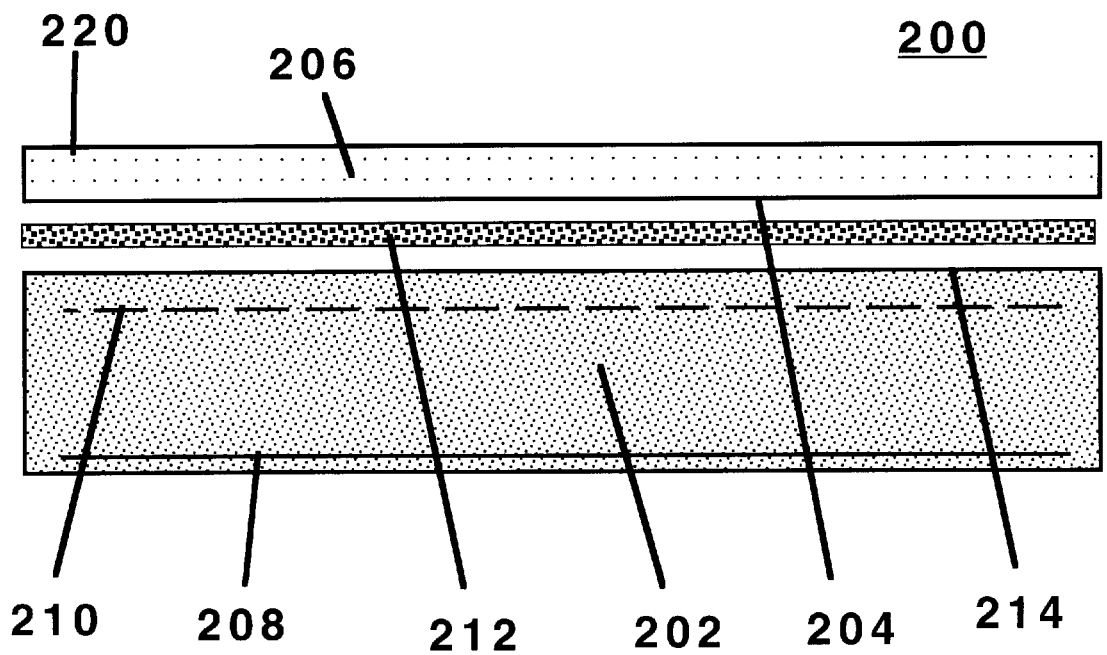
220  206  200
210  208  212  202  204  214
FIG. 2

CERAMIC ELECTROSTATIC CHUCK AND METHOD OF FABRICATING SAME

BACKGROUND OF THE INVENTION

1. Field of the Invention

The invention relates to a ceramic substrate support chuck for supporting a semiconductor wafer within a semiconductor processing system. More particularly, the invention relates to an improved multi-layered and doped ceramic electrostatic chuck, and method of fabricating same, for decreasing resistivity of a portion of the chuck for operation at room temperature by the Johnsen-Rahbek effect.

2. Description of the Background Art

Substrate support chucks are widely used to support substrates within semiconductor processing systems. A particular type of chuck used in high temperature semiconductor processing systems such as high temperature, physical vapor deposition (PVD) is a ceramic electrostatic chuck. These chucks are used to retain semiconductor wafers, or other substrates, in a stationary position in the process chamber during processing. FIG. 1 depicts a typical ceramic electrostatic chuck 100. Such electrostatic chucks contain one or more electrodes 104 and 106, respectively embedded within a unitary ceramic chuck body 102. The ceramic chuck body 102 is, for example, fabricated of aluminum nitride or boron nitride or alumina doped with a metal oxide such as titanium oxide or chromium oxide or some other ceramic material with similar resistive properties. This form of ceramic is partially conductive at high temperatures.

In use, a wafer rests flush against the surface of the chuck body as a chucking voltage is applied to the electrodes. Because of the conductive nature of the ceramic material at high temperatures, the wafer is primarily retained against the ceramic support by the Johnsen-Rahbek effect. The Johnsen-Rahbek effect establishes a small, but highly effective current flow between the substrate support surface and the substrate being retained. As such, a chucking force that is much greater than the force generated by a purely Coulombic effect electrostatic chuck retains the substrate to the support surface. Johnsen-Rahbek chucks are disclosed in U.S. Pat. Nos. 5,117,121, issued May 26, 1992 and 5,463,526 issued Oct. 31, 1995.

One disadvantage of using a chuck body fabricated from ceramic is that the resistivity of the chuck changes as a function of temperature. During wafer processing, the chuck is subjected to a wide range of temperatures, e.g., in the range of 20°–150° C. and could be as high as 300°–400° C. for other types of processes. At room temperature (approximately 20° C.) the resistivity of the chuck is on the order of approximately $10^{14}$ ohm-cm and decrease to approximately $10^{13}$ ohm-cm at temperatures around 150° C. This decrease in resistivity promotes a satisfactory chucking force via the Johnsen-Rahbek effect. However, as the temperature rises in the chamber, the resistivity level continues to decrease. As such, the current flow in the chuck body, hence the wafer, attributed to the Johnsen-Rahbek effect becomes larger. A wafer or similar substrate clamped to the support surface of a chuck having a high current flow can be damaged to the point of having a lower yield or being totally unusable.

Controlling the resistivity of the bulk material is essential to fabricating and using a Johnsen-Rahbek effect electrostatic chuck. The two parameters that are available for controlling resistivity are process temperature and the materials of the chuck. Unfortunately, decreasing process temperature does not provide an optimal resistivity to establish the Johnsen-Rahbek effect. Therefore, altering the materials comprising the chuck body is necessary. Doping the bulk material is a viable solution; however, it is critical to control the amount of doping. For example, an electrostatic chuck having a highly doped bulk material generates excessive charges which can short chucking electrodes and impede dechucking due to residual charge buildup. Such a condition is not suitable for a Johnsen-Rahbek effect chuck.

Therefore, a need exists in the art for an apparatus that has a resistivity level suitable for establishing the Johnsen-Rahbek effect to electrostatically clamp a substrate to a support surface and a concomitant method of fabricating same.

SUMMARY OF THE INVENTION

The disadvantages associated with the prior art are overcome by the present invention of a multi-layered, electrostatic ceramic chuck. Specifically, the invention provides a ceramic electrostatic chuck for retaining a substrate in a process chamber comprising a first layer having a top surface, a second layer disposed on the top surface of the first layer, and a third layer disposed on top of the second layer. The second layer alters the resistivity of the first layer during the fabrication process of the chuck. Specifically, the resistivity of the chuck is reduced to a value that facilitates establishment of the Johnsen-Rahbek effect and promotes wafer processing at room temperature.

Additionally, the invention provides a method for fabricating a multi-layered ceramic electrostatic chuck for retaining a substrate in a process chamber. The method comprises the steps of providing a first layer, disposing a second layer on a bottom surface of a third layer, disposing the third layer with disposed second layer upon the first layer, and sintering the multi-layered chuck.

The advantages of such a configuration are establishment of a suitable chucking force, reduced dechucking time, reduced thermal stress and fatigue on chamber components and wafers which result in reliable wafer handling, greater uniformity amongst a batch of processed wafers and faster wafer throughput.

BRIEF DESCRIPTION OF THE DRAWINGS

The teachings of the present invention can be readily understood by considering the following detailed description in conjunction with the accompanying drawing, in which:

FIG. 1 depicts a cross-section view of a prior art ceramic electrostatic chuck;

FIG. 2 depicts an exploded cross-sectional view of the layers of the ceramic electrostatic chuck in accordance with the teachings of the present invention.

To facilitate understandings identical reference numerals have been used, where possible, to designate identical elements that are common to the figures.

DETAILED DESCRIPTION

Figure 3:
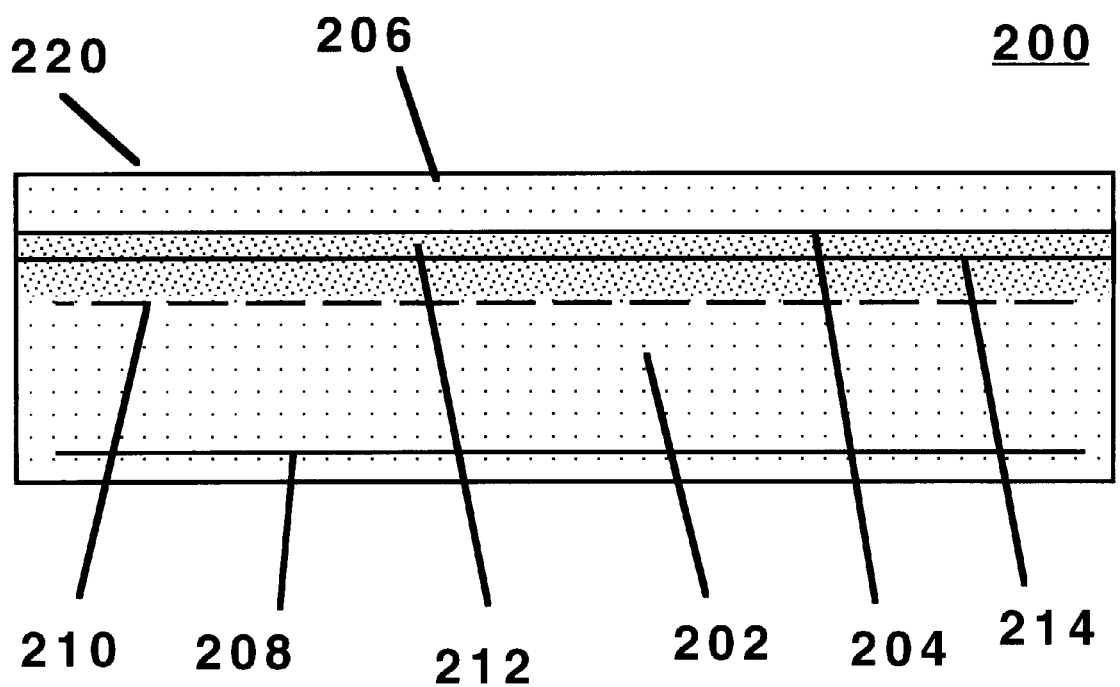
FIG. 3 depicts a cross-sectional view of the completely fabricated ceramic electrostatic chuck.

FIG. 2 depicts an exploded cross-sectional view of a plurality of layers of an electrostatic chuck 200 for retaining a substrate e.g., a semiconductor wafer (not shown), in a process chamber of a semiconductor wafer process system. The chuck 200 is preferably a three layer composite that is fabricated into a single unit with the semiconductor wafer being supported and retained on a top surface 220 of the chuck 200. Specifically, a first layer 202 forms the base of the chuck 200. This first layer 202 is preferably a dielectric material having moderate resistivity characteristics at room temperature. Ideally, the first layer 202 is a ceramic such as aluminum nitride in a pre-sintered state. In a preferred embodiment of the invention, the first layer 202 is approximately 10 mm thick.

Additionally, the first layer 202 is provided with various elements necessary to process a semiconductor wafer. Specifically, in the pre-sintered, green body state, the first layer 202 is putty-like in consistency which facilitates the addition of one or more chucking electrodes 210 and one or more heater electrodes 208. The chucking electrodes 210 are disposed proximate an upper surface 214 of the first layer 202 and can be arranged or configured in any way suitable for retaining the wafer against the top surface 220 of the chuck 200. For example, there can be one monopolar electrode, two or more bipolar electrodes, multi-zoned bipolar electrodes and the like. Similarly, the heater electrodes can be a single heater, two or more heaters for zoned heating and the like. Chucking and heating electrodes are selected from the group consisting of molydbenum, tungsten. These electrodes are placed within the green body state first layer 202 along with any attendant feedthroughs (not shown) to provide a connection from the electrodes to a power source (not shown). A second layer 212 is disposed on a bottom surface 204 of a third layer 206 This second layer 212 is a dopant material which is capable of altering the resistivity of the chuck 200. The dopant is any material that is capable of decreasing the resistivity of the chuck at room temperature to a value of approximately $10^{10-12}$ ohm-cm. In a preferred embodiment of the invention, the dopant is carbon. Specifically, carbon is deposited on the bottom surface 204 the third layer 206. In a preferred embodiment of the invention, the carbon is deposited by a sputtering technique. Sputtering allows a high degree of deposition control in the resultant resistivity of the completed chuck. That is, the thickness of the sputtered layer of dopant can be varied to alter the desired resistivity of the chuck. As such, a wide range of chucks having different resistivity characteristics can be fabricated to comply with various types of specifications. For example, in the subject apparatus, the dopant thickness is in the range of approximately 100–10000 Å. In a preferred embodiment of the invention, the thickness of the dopant material is approximately 5000 Å. Alternately, any other method employed for depositing material is suitable for forming the dopant layer. For example, the dopant layer 212 can also be formed by, but not limited to, such techniques as screen printing, vacuum arc deposition and the like. Likewise, a variety of dopants may be substituted for carbon such as oxygen, silicon, berillium, cadmium, zinc and magnesium.

The third layer 206 is disposed on top of the first layer 202 to produce the complete chuck 200. The third layer 206 is preferably a dielectric material. In order to avoid anomalies during wafer processing or premature failure of the chuck, the first layer 202 and third layer 206 should preferably be the same material or at least be materials that have thermal expansion coefficients that are relatively close in value. Ideally, the third layer 206 is a ceramic such as aluminum nitride in a fully cured, i.e., post-sintered state. In a preferred embodiment of the invention, the third layer 206 is a disc approximately 2–10 mm thick. Alternately, the third layer is boron nitride.

The post-sintered third layer 206 is oriented so that the second layer 212 is disposed upon the first layer 202 and lies between the first layer 202 and the third layer 206 to create the multi-layered chuck 200. Specifically, the bottom surface 204 of the third layer 206 having the deposited second layer 212 is placed in contact with the upper surface 214 of the first layer 202. Next, the multi-layered chuck 200 is sintered in a furnace to cure the green body state first layer 202. Specifically, the chuck 200 is sintered at a temperature in the range of approximately 1900°–2000° C. at a pressure of approximately above 1 atm in nitrogen for approximately 8–10 hours.

The sintering process produces an electrostatic chuck having a level of dopant material incorporated into the body which decreases resistivity. FIG. 3 depicts the chuck of FIG. 2 in a completely assembled and fabricated state. The dopant material e.g., carbon, diffuses into the green body state first layer 202 during the sintering process. The chucking electrodes 210 act as a diffusion barrier so that most of the diffusion occurs between the upper surface 214 of the first layer 202 and the chucking electrodes 210. As such, a lower value of resistivity is realized in the first layer 202. For example, at room temperature, aluminum nitride has a resistivity on the order of $10^{14}$ ohm-cm. An electrostatic chuck manufactured under the methods disclosed can have a resistivity on the order of $10^{10-12}$ ohm-cm at room temperature. This decrease in resistivity provides a highly desirable chucking and dechucking conditions. Specifically, the Johnsen-Rahbek effect establishes a reliable chucking force that is greater than that provided by a Coulombic chuck. Since doping of the first layer 202 is highly controlled there is no excessive charges in the chuck which need to be eliminated to effectively dechuck the wafer from the top surface 220. Additionally, lower processing temperatures place less thermal stress on chamber components as well as a wafer being processed. Such conditions result in greater uniformity amongst a batch of processed wafers and faster wafer throughput.

The decrease in resistivity is also partially dependent upon the purity of the aluminum nitride when it is in the green state. That is, binders are added to the green body in order to facilitate formation of the desired shape and features of the body. These binders e.g., polyvinylalcohol, polyvinylbutyral, polypropylenecarbonate and the like are throughout the green body. As such, they act as contaminants that alter the resistivity. To alleviate this condition, a debinderization step is added to the fabrication process in order to increase the purity and density of the aluminum nitride and to allow for a proper sintering process. The debinderization process is carried out on the green body first layer 202 prior to joining it with the second layer 212 and third layer 206. For example, the debinderization step consists of conducting a burnout of the material to be debinderized, i.e., the first layer 202 in air at a temperature of approximately 500° C. for approximately one hour. Under these conditions, the binders are removed, i.e., evaporate out of material.

In sum, a multi-layered electrostatic chuck is provided that is capable of operating i.e., retaining a semiconductor wafer to be processed, via the Johnsen-Rahbek effect, at room temperature. A dopant is provided between a post-sintered and a pre-sintered material prior to a final sintering step. The final sintering step not only cures the pre-sintered material retaining relevant processing elements such as heating and chucking electrodes, but also promotes infusion of the dopant material into the pre-sintered material to decrease the characteristic resistivity of the material. The advantages of such a configuration are much shorter ramp up time to achieve desired chamber environment, reduced thermal stress and fatigue on chamber components and wafers which result in greater uniformity amongst a batch of processed wafers and faster wafer throughput.

Although the subject invention is described in terms of depositing a dopant on the bottom surface of a post-sintered layer, this does not preclude the addition of any dopant layers to any multi-layered chuck and methods of fabricating same. For example, one skilled in the art may add a dopant to the pre-sintered material and dispose a third layer with a non-sputtered bottom side at any step during the fabrication process. Additionally, the third layer can be preconditioned. In other words, the third layer is provided with a layer of carbon on a bottom surface prior to the deposition step. As such, the deposited carbon will more readily diffuse into the pre-sintered layer than into the post-sintered, pre-conditioned layer.

Although various embodiments which incorporate the teachings of the present invention have been shown and described in detail herein, those skilled in the art can readily devise many other varied embodiments that still incorporate these teachings.

What is claimed is:

1. A multi-layered ceramic electrostatic chuck for retaining a substrate in a process chamber comprising:

a first layer having an upper surface, an electrode disposed within said first layer, a second layer disposed upon the upper surface of the first layer, and a third layer disposed on top of the second layer wherein the second layer alters a resistivity of the first layer.

2. The apparatus of claim 1 wherein the first layer is aluminum nitride.

3. The apparatus of claim 2 wherein the second layer is a dopant.

4. The apparatus of claim 3 wherein the dopant is sputtered onto a bottom surface of the third layer.

5. The apparatus of claim 4 wherein the dopant is carbon.

6. The apparatus of claim 5 wherein the third layer is aluminum nitride.

7. The apparatus of claim 6 wherein the first layer of aluminum nitride is in a pre-sintered state and the third layer of aluminum nitride is in a post-sintered state.

8. The apparatus of claim 7 wherein the multi-layered electrostatic chuck is sintered at a temperature in the range of approximately 1900°–2000° C.

9. A method for fabricating a multi-layered ceramic electrostatic chuck for retaining a substrate in a process chamber, the chuck having a first layer having an upper surface, a second layer disposed upon the upper surface of the first layer, and a third layer disposed on top of the second layer wherein the second layer alters a resistivity of the first layer, the method comprising the steps of:

providing the first layer, disposing an electrode within said first layer disposing the second layer on a bottom surface of the third layer, debinderizing the first layer, disposing the third layer with disposed second layer upon the debinderized first layer, and sintering the multi-layered chuck.

10. The method of claim 9 wherein the step of disposing the third layer with disposed second layer upon the first layer further comprises orienting the third layer so that the bottom surface of the third layer contacts the upper surface of the first layer.

11. The method of claim 10 wherein the first layer is aluminum nitride.

12. The method of claim 11 wherein the second layer is disposed onto the bottom surface of the third layer by sputtering.

13. The method of claim 12 wherein the second layer is a dopant.

14. The method of claim 13 wherein the dopant is carbon.

15. The method of claim 14 wherein the third layer is aluminum nitride.

16. The method of claim 15 wherein the first layer of aluminum nitride is in a pre-sintered state and the third layer of aluminum nitride is in a post-sintered state.

17. The method of claim 16 wherein the multi-layered electrostatic chuck is sintered at a temperature in the range of approximately 1900°–2000° C.

18. The method of claim 17 wherein the debinderization step further comprises conducting a burnout of the first layer in air at a temperature of approximately 500° C. for approximately one hour.

19. A multi-layered ceramic electrostatic chuck for retaining a substrate in a process chamber of a semiconductor wafer process system comprising:

a first layer of pre-sintered aluminum nitride having an upper surface, an electrode disposed within said first layer, a second dopant layer of carbon contacting the upper surface of the first layer of pre-sintered aluminum nitride, and a third layer of post-sintered aluminum nitride in the form of a disc disposed on top of the second dopant layer of carbon wherein the second dopant layer of carbon is sputtered onto a bottom surface of the third layer post-sintered aluminum nitride disc and alters a resistivity of the first layer of pre-sintered aluminum nitride when the chuck is sintered at a temperature in the range of approximately 1900°–2000° C.

* * * * *